US012439714B2

(12) United States Patent
Chung et al.

(10) Patent No.: US 12,439,714 B2
(45) Date of Patent: Oct. 7, 2025

(54) 3D CMOS IMAGE SENSOR STRUCTURE AND METHOD OF FABRICATING THE SAME

(71) Applicant: Powerchip Semiconductor Manufacturing Corporation, Hsinchu (TW)

(72) Inventors: Chih-Ping Chung, Hsinchu (TW); Ming-Yu Ho, Taichung (TW); Saysamone Pittikoun, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 429 days.

(21) Appl. No.: 18/092,450

(22) Filed: Jan. 3, 2023

(65) Prior Publication Data

US 2024/0072083 A1 Feb. 29, 2024

(30) Foreign Application Priority Data

Aug. 30, 2022 (TW) .................................. 111132684

(51) Int. Cl.
*H10F 39/00* (2025.01)
*H10F 39/18* (2025.01)

(52) U.S. Cl.
CPC ..... *H10F 39/80377* (2025.01); *H10F 39/014* (2025.01); *H10F 39/024* (2025.01); *H10F 39/026* (2025.01); *H10F 39/182* (2025.01); *H10F 39/805* (2025.01); *H10F 39/8053* (2025.01); *H10F 39/8057* (2025.01); *H10F 39/8063* (2025.01); *H10F 39/807* (2025.01)

(58) Field of Classification Search
CPC . H10F 39/80377; H10F 39/014; H10F 39/807
See application file for complete search history.

(56) References Cited

U.S. PATENT DOCUMENTS

| 2016/0056201 A1 | 2/2016 | Yamashita |
| 2017/0018591 A1* | 1/2017 | Yamaguchi ......... H10F 39/8023 |
| 2021/0242270 A1* | 8/2021 | Lim ................. H10F 39/80373 |
| 2021/0273006 A1* | 9/2021 | Tagashi ................. H01L 23/481 |
| 2023/0299113 A1* | 9/2023 | Iida ..................... H10F 39/8027 |
| | | 257/291 |

FOREIGN PATENT DOCUMENTS

TW I752790 B 1/2022

* cited by examiner

*Primary Examiner* — Yara B Green
*Assistant Examiner* — Coraline A Nettles
(74) *Attorney, Agent, or Firm* — Winston Hsu

(57) ABSTRACT

A 3D CMOS image sensor is provided in the present invention, including a semiconductor substrate, a photodiode and a well formed in the semiconductor substrate, a shallow trench isolation (STI) layer formed on a front surface of the semiconductor substrate, a fin protruding upwardly from the semiconductor substrate through the STI layer, wherein the fin is composed of the photodiode and the well, a first gate spanning the photodiode portion and the well portion abutting the photodiode portion of the fin to constitute a transfer transistor, a second gate spanning in the middle of the well portion of the fin to constitute a reset transistor, and a floating diffusion region in the well portion of the fin between the first gate and the second gate electrically connecting the transfer transistor and the reset transistor.

10 Claims, 19 Drawing Sheets

3D CMOS IMAGE SENSOR STRUCTURE AND METHOD OF FABRICATING THE SAME

BACKGROUND OF THE INVENTION

1. Field of the Invention

The present invention relates generally to a complementary metal-oxide-semiconductor (CMOS) image sensor structure, and more specifically, to a CMOS image sensor structure with 3D transistor architecture and method of fabricating the same

2. Description of the Prior Art

Electronic equipment having semiconductor devices are essential for many modern applications. Solid-state (e.g. semiconductor) image sensors are commonly involved in electronic equipment used for sensing light, wherein complementary metal-oxide-semiconductor image sensors (CIS, which referred hereinafter as CMOS image sensor) are widely used in various applications and fields, such as digital camera and mobile phone cameras. CMOS image sensor typically includes an array of picture elements (pixels). Each pixel includes transistors, capacitors and photodiodes, wherein electrical energy is induced in the photodiode upon exposure to the luminous environment. Each pixel generates electrons proportional to an amount of light entering the pixel. The electrons are converted into a voltage signal in the pixel and are further transformed into digital signal.

CMOS image sensors are classified as front side illuminated (FSI) image sensors and back side illuminated (BSI) image sensors, depending on the light path difference. The BSI image sensors are becoming increasingly popular, for its light is incident on a back surface of a substrate of the image sensor and hits the photodiode directly without obstruction from dielectric layers and interconnect layers formed on the substrate. Such a direct incidence makes the BSI image sensor more sensitive to the light.

Nevertheless, as far as common planar BSI image sensor nowadays is concerned, regions of photodiode and active areas like sources and drains of CMOS transistors in the structure all cover the layout area on the same substrate plane, which is disadvantageous to the miniaturization of pixel size. In order to miniaturize pixel size without compromising full well capacity (FWC) and fill factor (FF) required by the sensor, those of skilled in the art need to improve the architecture of current common BSI image sensor, in order to further increase device density and photosensitive performance.

SUMMARY OF THE INVENTION

In the light of limitations of the aforementioned current planar BSI image sensor architecture, the present invention hereby provides a novel 3D CMOS image sensor structure, with feature of fabricating one end of the photodiode in a form vertically protruding from the substrate surface to connect with the source node of transistor, so that channels and isolation structures between the transistors may be set on a layout area overlapping the photodiode, thereby significantly reducing the layout area required by pixel units. The photodiode in this design may be fully enclosed by the isolation structures to further reduce crosstalk of photoelectric signal.

One aspect of the present invention is to provide a 3D CMOS image sensor structure, including a semiconductor substrate with a front surface and a back surface. A photodiode is formed in the semiconductor substrate. A well is formed in the semiconductor substrate, and the well partially overlaps the photodiode in a direction vertical to the front surface. A shallow trench isolation layer is formed on the front surface. A fin protrudes upwardly on the front surface from the semiconductor substrate through the shallow trench isolation layer, wherein the fin is composed of the photodiode and the well. A first gate is on the shallow trench isolation layer and spans a photodiode portion of the fin and a well portion of the fin abutting the photodiode portion, thereby constituting a transfer transistor. A second gate is on the shallow trench isolation layer and spans in the middle of the well portion of the fin, thereby constituting a reset transistor. A floating diffusion region is in the well portion of the fin between the first gate and the second gate, wherein the transfer transistor is electrically connected with the reset transistor through the floating diffusion region.

Another aspect of the present invention is to provide a method of fabricating a 3D CMOS image sensor structure, including steps of providing a semiconductor substrate with a front surface and a back surface, performing a first doping process from the front surface to form a photodiode and a well in the semiconductor substrate, wherein the well partially overlaps the photodiode in a direction vertical to the front surface. A patterning process is performed to the semiconductor substrate to forma fin, wherein the fin is composed of the photodiode and the well. A shallow trench isolation layer is formed on the front surface of the semiconductor substrate, wherein the fin protrudes on the front surface through the shallow trench isolation layer. A first gate and a second gate are formed on the front surface, wherein the first gate spans a photodiode portion of the fin and a well portion of the fin abutting the photodiode portion, and the second gate spans in the middle of the well portion of the fin. The first gate and the second gate respectively constitute a transfer transistor and a reset transistor of the 3D CMOS image sensor structure. A second doping process is performed to form a drain and a floating diffusion region in the fin not covering by the first gate and the second gate, wherein the floating diffusion region is between the first gate and the second gate and is electrically connected the transfer transistor and the reset transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
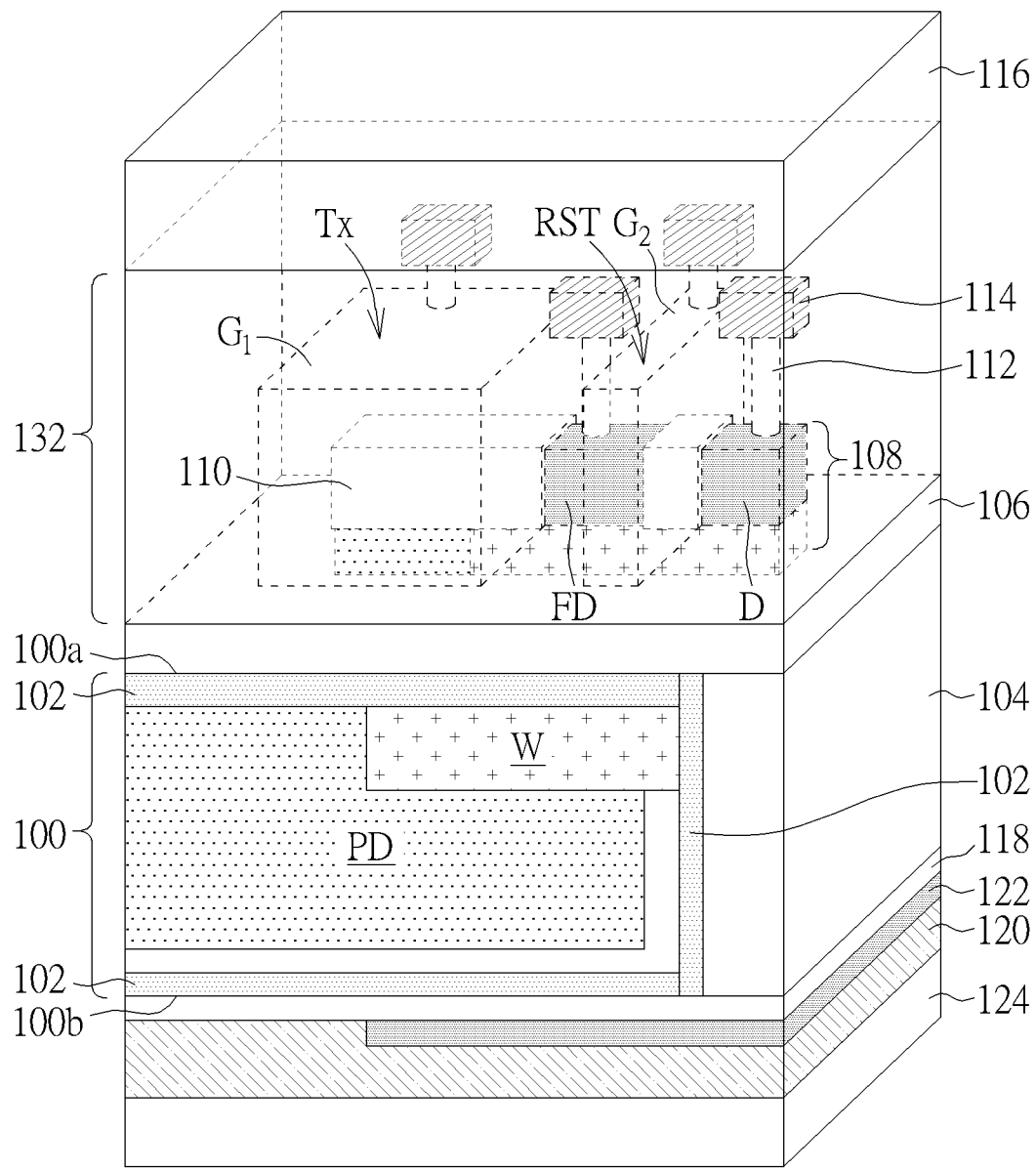
FIG. 1 is a schematic cross-sectional view of a 3D CMOS image sensor structure in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature relationship to another element(s) or feature(s) as illustrated in the figures.

As used herein, the term. "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

As used herein in the description of the invention, the "n" and "p" designations, as in "n-type" and "p-type", are used in the common manner to designate donor and acceptor type impurities which promote electron and hole type carriers respectively as the majority carriers. The "++" symbol, when used as a suffix with an impurity type should be interpreted to mean that the doping concentration of that impurity is heavier than the doping associated with just the letter identifying the impurity type without the "+" suffix. Conversely, the "−" symbol, when used as a suffix with an impurity type should be interpreted that the doping concentration of that impurity is lighter than the doping associated with just the letter identifying the impurity type without the "−" suffix.

The term "pixel" refers to a picture element unit cell containing a photo sensor and devices, such as transistors for converting electromagnetic radiation to an electrical signal. An image device would include multiple pixels arranged in a 2D array with multiple columns and rows, and peripheral circuit and other components may be provided around the pixel array, which may include various circuits for the operation and process of the image sensor. For purposes of illustration, a representative pixel is illustrated in the figures and description herein, and typically fabrication of all pixels in an imager will proceed simultaneously in a similar fashion. It should be understood that the invention is applicable to pixel cells in any arrangement and orientation for integration with other components of a semiconductor device.

The 3D CMOS image sensor structure of the present invention will now be described in following embodiment with reference to the 3D structure in FIG. 1. Please note that, although the drawings provided in the specification all illustrate only single pixel unit, it should be understood that the real CMOS image sensor may include multiple pixels arranged in a 2D array with surrounding peripheral circuits, which may including various circuits required by the operation and process of the image sensor.

Please refer to FIG. 1, which is a schematic cross-sectional view of a 3D complementary metal-oxide-semiconductor image sensor (CIS, which referred hereinafter as CMOS image sensor) structure in accordance with the preferred embodiment of the present invention. The 3D CMOS image sensor provided in the present invention is a back side illuminated (BSI) CMOS image sensor, with incident light entering from a back surface of the semiconductor substrate with respect to a front side where pixel transistors locate, so as to prevent the problem that receiving light may be easily interrupted by intermediate circuit layers in the design of front side illuminated (FSI) CMOS image sensor. The whole CMOS image sensor is constructed on a semiconductor substrate 100, such as a P-type lightly doped silicon substrate, with regions like pixel regions or peripheral regions defined thereon, wherein the pixel region is used to set pixel units that may be arranged uniformly thereon in a form of 2D array. The peripheral region is used to set various peripheral circuits that may work together with the pixel unit, such as timing circuit, control circuit, multiplexer, A/D conversion circuit, image compression circuit or computer interface module. The drawings provided in the present invention are focused on the description of structures and features of single pixel unit or cell on the pixel region.

Refer still to FIG. 1. The semiconductor substrate 100 is provided with a front surface (faces up in the FIG. 100a and a back surface (faces down in the FIG. 100b, wherein the front surface 100a is a non-light-receiving surface used to form structures like various transistor devices and circuits required by the image sensor. The back surface 100b is a light-receiving surface used to form various optical films or structures, such as anti-reflection layers or micro lens. Doped regions like a photodiode PD and a well W, ex. N-type photodiode and P-type well, are formed inside the semiconductor substrate 100, wherein the photodiode PD is a kind of semiconductor P-N junction or PIN junction device. Image light entering the photodiode PD will be absorbed to generate current, so that optical signal can be converted into electric signals in the form of photoelectron for storage and process. Active areas of transistors to be fabricated in later processes, such as source and drain of a reset transistor, may be formed on the well W. In the embodiment of present invention, the photodiode PD and the well W partially overlap in a direction vertical to the front surface 100a of substrate, which is different from the design of conventional planar CMOS image sensor that the photodiode PD and well W cover different planar layout areas, so that required layout space may be reduced in the present invention. For example, as shown in the figure, the photodiode PD preferably covers whole pixel region of the semiconductor substrate 100 in order to receive as more incident light as possible to conduct photoelectric conversion. The well W is formed in the semiconductor substrate 100 near the front surface 100a (non-light-receiving surface) and may fully overlap the photodiode PD without affecting the receiving of image light, and the pixel transistor region defined thereon may be apart of the pixel region, for example one-sixth of the pixel region. In addition, the N-type photodiode and P-type well are merely examples. In other embodiment, it may be P-type photodiodes and N-type wells used in the CMOS image sensor.

Refer still to FIG. 1. A deep trench isolation (DTI) 104 is formed in the semiconductor substrate 100 to isolate and define pixel units in the pixel region. Since the function of deep trench isolation 104 is to block the incident light from leaving the portion of photoelectric conversion in the image sensor, its material may be selected from oxides with refractive index smaller than the one of semiconductor substrate 100 to achieve total internal reflection. Undoped polysilicon is also an option. The depth of deep trench isolation 104 may encompass entire semiconductor substrate 100. In addition, in the embodiment of present invention, a surface doped layer 102, ex. a P+ heavily doped layer, may be formed in the front surface 100a, back surface 100b and sidewalls (between the semiconductor substrate 100 and the deep trench isolation 104) of the whole semiconductor substrate 100, in order to completely enclose the photodiode PD and the well W in the pixel unit. The function of surface doped layer 102 is to prevent the issue of dark current or noise resulted from the generation and recombination effects of electrons and holes formed at interface defects between the semiconductor substrate 100 and the enclosing oxide-based structure (like deep trench isolation 104 and shallow trench isolation layer 106).

Refer still to FIG. 1. A shallow trench isolation layer 106 is formed on the front surface 100a of semiconductor substrate 100, with material like silicon oxide to isolate various transistor devices to be formed in later processes. Different from the shallow trench isolation layer of conventional planar CMOS image sensor that can only isolates different pixel transistor devices, the shallow trench isolation layer 106 is formed on entire front surface 100a of semiconductor substrate 100 and may enclose the photodiode PD in the pixel unit (except the back surface 100b for receiving light) together with the aforementioned deep trench isolation 104 in the semiconductor substrate 100, so that crosstalk resulted from the photoelectric signal to adjacent devices may be significantly reduced, such as the crosstalk resulted from the generated electrical signal to source follower transistor (not shown) through abutting well W.

Another feature of the present invention lies in the pixel transistors on the front surface 100a of semiconductor substrate 100 all in the form of 3D transistor, so that required layout space may be further reduced. As shown in FIG. 1, the CMOS image sensor is provided with a fin 108 protruding upwardly and vertically on the front surface 100a of semiconductor substrate 100 through the shallow trench isolation layer 106. In the embodiment of present invention, the fin 108 is composed collectively of the photodiode PD and the well W. That is, the fin 108 is an extension of the two doped regions from the substrate plane, with two portions of different doping types like N-type and P-type. Specifically, a first gate $G_1$ is on the shallow trench isolation layer 106 and spans a photodiode PD portion of fin 108 and a well W portion abutting the photodiode PD portion, thereby constituting a transfer transistor $T_X$. A second gate $G_2$ is on the shallow trench isolation layer 106 and span in the middle of the well W portion of fin 108, thereby constituting a reset transistor RST. The material of first gate $G_1$ and second gate $G_2$ may be polysilicon or metal, ex. P− lightly doped polysilicon, which preferably extends in a direction perpendicular to the fin 108 and spans the fin 108. A gate insulating layer 110, ex. a silicon oxide layer or a high-k dielectric layer, is formed between the gates $G_1$, $G_2$ and the fin 108. In addition, a drain D and a floating diffusion region FD (ex. N+ heavily doped region) are further formed in the well W portion of fin 108 not spanned and covered by the second gate $G_2$, thereby constituting an NMOS device (may be PMOS device in other embodiment), wherein the floating diffusion region FD is between the first gate $G_1$ and the second gate $G_2$, serving concurrently as a drain of transfer transistor $T_X$ and a source of reset transistor RST. In other words, the transfer transistor $T_X$ is electrically connected with the reset transistor RST through the floating diffusion region FD. The transfer transistor $T_X$ composed of the first gate $G_1$ and the fin 108 may control the transfer of the electric charges generated by the photodiode PD when which receives incident light. The reset transistor RST composed of the second gate $G_2$ and the fin 108 may control the removal and reset of the electric charges remaining in the floating diffusion region FD through the drain D connecting to external circuits. Please note that devices like source follower and selector may be further provided in real CMOS image sensor. Since these components are not key points of the present invention, relevant description will be omitted for the conciseness of drawings.

With respect to conventional planar CMOS image sensor without fin structure like fin 108, channels, drains, sources and floating diffusion regions of the transistors are all set in the semiconductor substrate, which may cover limited layout space together with the photodiode PD. In comparison thereto, the design of 3D CMOS image sensor in the present invention form the channels, drains, sources and the floating diffusion regions of original transistors in the fin structure on the substrate, with the advantage that required layout space may be significantly reduced without compromising full well capacity (FWC) and fill factor (FF) required by the sensor in the miniaturization of device. In addition, the aforementioned design of 3D transistor protruding from the surface of substrate also enables the use of shallow trench isolation layer 106 covering the whole surface of semiconductor substrate 100 to isolate between the transistors and various doped regions of semiconductor substrate 100 for effectively solving the crosstalk issue.

Refer still to FIG. 1. A dielectric layer 132 is formed on the shallow trench isolation layer 106 covering the aforementioned first gate $G_1$, second gate $G_2$ and fin 108, with material like silicon oxide or low-k dielectrics. CMOS back-end-of-line (BEOL) interconnects like contacts 112 and conductive lines 114 may be further formed in the dielectric layer 132 to connect the first gate $G_1$, second gate $G_2$, drain D and the floating diffusion region FD with external circuits. Lastly, a carrier substrate 116 may be bonded on entire dielectric layer 132 to function as a substrate for the backside grinding process later and to increase structural strength of the wafer. The carrier substrate 116 may be made of high temperature resistant glass, glass-based materials, or alternatively, semiconductor materials.

Refer still to FIG. 1. The components on the back surface 100b of semiconductor substrate 100 will now be described in following embodiment. An anti-reflection layer 118 is formed on the back surface 100b of semiconductor substrate 100 to increase the amount of incident light from back surface 100b. The refractive index of anti-reflection layer 118 is preferably smaller than the one of Si-based surface doped layer 102 connected therewith, for example, using the material having smaller refractive index like silicon oxide ($SiO_2$), silicon nitride (SiN) and/or titanium oxide ($TiO_2$). It may also be a multilayer structure with gradient refractive index to achieve better incidence effect. A light shielding layer 122, ex. a tungsten film, is formed on the anti-reflection layer 118. In the embodiment of present invention, the light shielding layer 122 fully or mostly overlaps the well W, reset transistor RST and other transistors in a direction vertical to the back surface 100b, in order to reduce the amount of stray light when the image light enters. A color filter layer 120 is formed on the light shielding layer 122 and anti-reflection layer 118. The color of color filter layer 120 on pixels may be different, for example, with three different colors of red (R), green (G) and blue (B), which may be formed through spin-coating light-sensitive resins with pigments or dyes on the substrate. The function of color filter layer 120 is to filter the image light into lights with divided primary colors like red (R), green (G) and blue (B). The color information of original image light may be obtained according to the relative strength ratio of mixed electric signal corresponding to the received lights from the pixel units or cells, so that full-color image may be rendered on the electronic device. A micro lens 124 is further formed on the color filter layer 120. Each micro lens 24 would correspond to a pixel unit, which may be formed by using resin-based material like styrene, acrylic acid and siloxane. The micro lens 124 may focus the incident image light on corresponding pixel region to improve light intensity.

Figure 10:
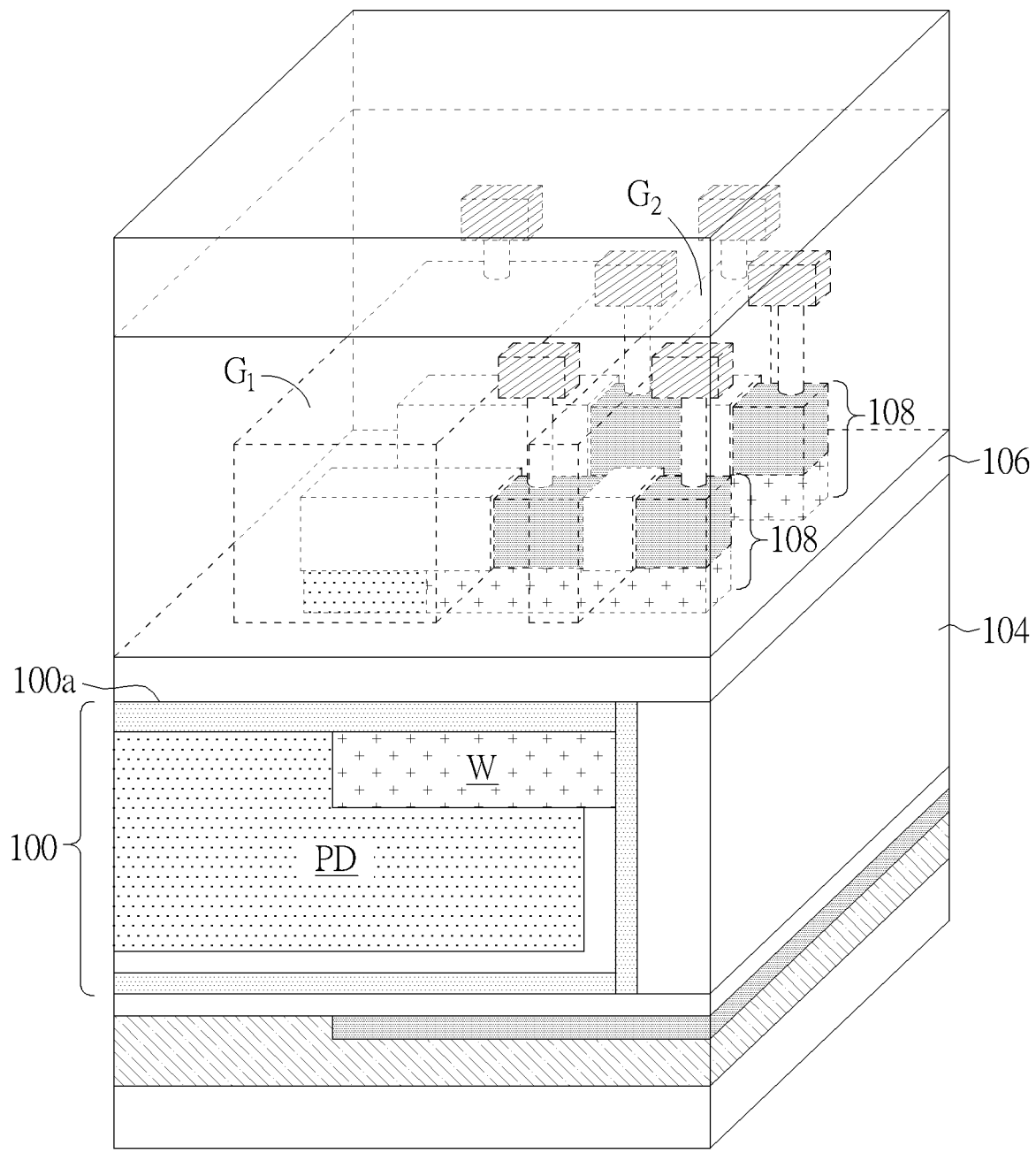
FIG. 10 is a schematic isometric view of the 3D CMOS image sensor structure in accordance with another embodiment of the present invention.

Please now refer to FIG. 10, which is a schematic isometric view of the 3D CMOS image sensor structure in accordance with another embodiment of the present invention. The embodiment shown in FIG. 10 is similar to the one shown in FIG. 1, with difference that the CMOS image sensor structure in FIG. 10 includes multiple fins 108, rather than single fin 108, extending upwardly from each photodiode PD and each well W through the shallow trench isolation layer 106 and protruding on the front surface 100a. These fins 108 are spaced apart in parallel and are spanned by a first gate $G_1$ and a second gate $G_2$. This design features a transfer transistor and a reset transistor respectively having multiple channels to control the transfer of photoelectrons, so that transfer efficiency may be significantly improved.

Figure 11:
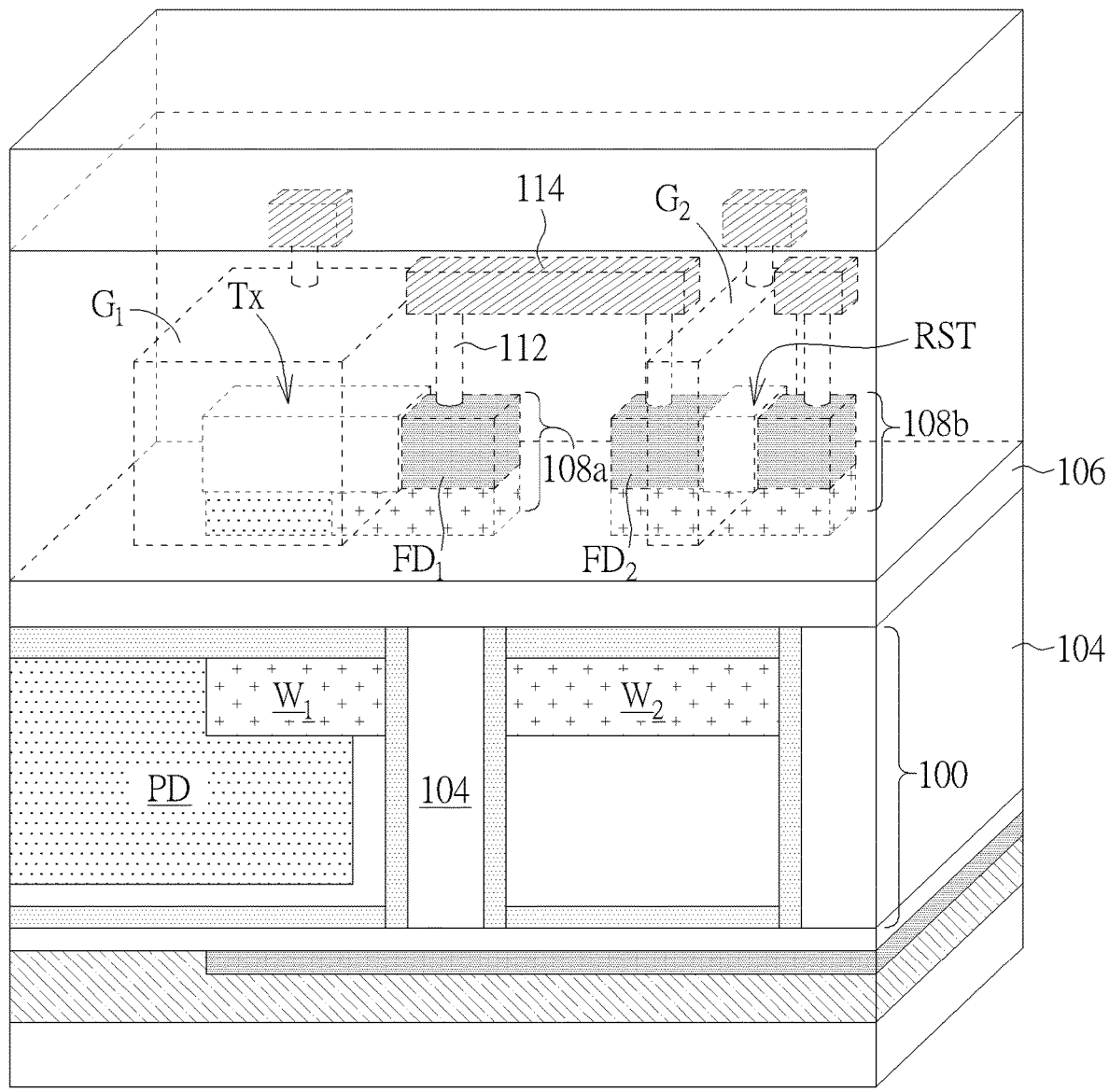
FIG. 11 is a schematic isometric view of the 3D CMOS image sensor structure in accordance with still another embodiment of the present invention.

Please refer now to FIG. 11, which is a schematic isometric view of the 3D CMOS image sensor structure in accordance with still another embodiment of the present invention. The embodiment shown in FIG. 11 is similar to the one shown in FIG. 1, with difference that the fin in the CMOS image sensor structure of FIG. 11 includes a first fin 108a and a second fin 108b separated from each other. The first gate $G_1$ is on the first fin 108a and the second gate $G_2$ is on the second fin 108b. More specifically, the first fin 108a is fully composed of the extensions of photodiode PD and well W, while the second fin 108b is fully composed of the extensions of well W. In this embodiment, the floating diffusion region FD is also divided into a first floating diffusion region $FD_1$ and a second floating diffusion region $FD_2$, which are respectively in the first fin 108a and the second fin 108b and are electrically connected with each other through interconnects like contact 112 and conductive line 114. The corresponding well in the semiconductor substrate 100 is also divided into a first well $W_1$ and a second well $W_2$, which are separated by the deep trench isolation 104, wherein the extension of first well $W_1$ and photodiode PD constitute the first fin 108a, while the extension of second well $W_2$ solely constitutes the second fin 108b. This design may further reduce crosstalk between the transfer transistor $T_X$ and the reset transistor RST since their wells and fins are separated from each other.

The 3D CMOS image sensor structure of present invention will now be described in following embodiment with reference to the 3D structure shown sequentially in FIG. 2A to FIG. 9A and with reference to the cross-sectional structure shown in FIG. 2B to FIG. 9B, wherein the cross-sectional views are taken through the section lines A-A' and the section lines B-B' respectively in their corresponding isometric views. Please note that, although the drawings provided in the specification all illustrate only single pixel unit, it should be understood that a real CMOS image sensor may include multiple pixels arranged in a 2D array with surrounding peripheral circuits, including various circuits required by the operation and process of the image sensor.

Figure 2A:
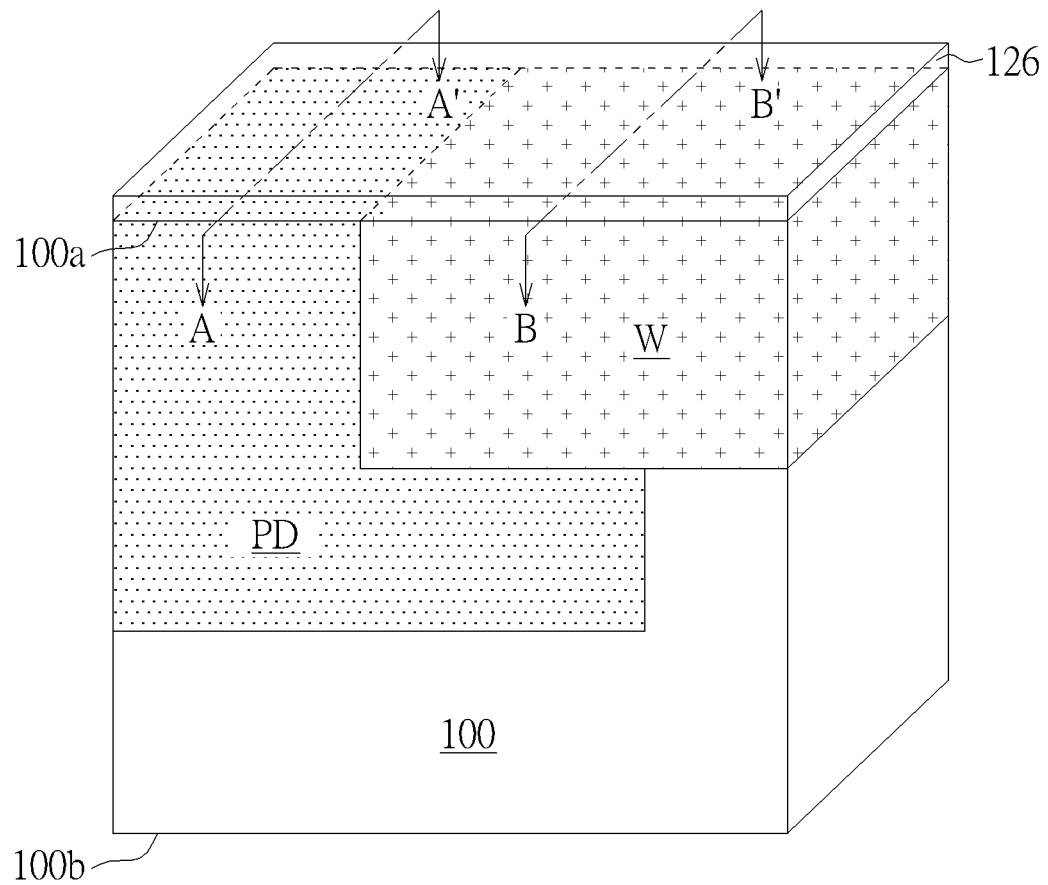
FIG. 2A, FIG. 3A, FIG. 4A, FIG. 5A, FIG. 6A, FIG. 7A, FIG. 8A and FIG. 9A are schematic isometric views illustrating the process flow of fabricating the 3D CMOS image sensor structure in accordance with the preferred embodiment of present invention.
Figure 2B:
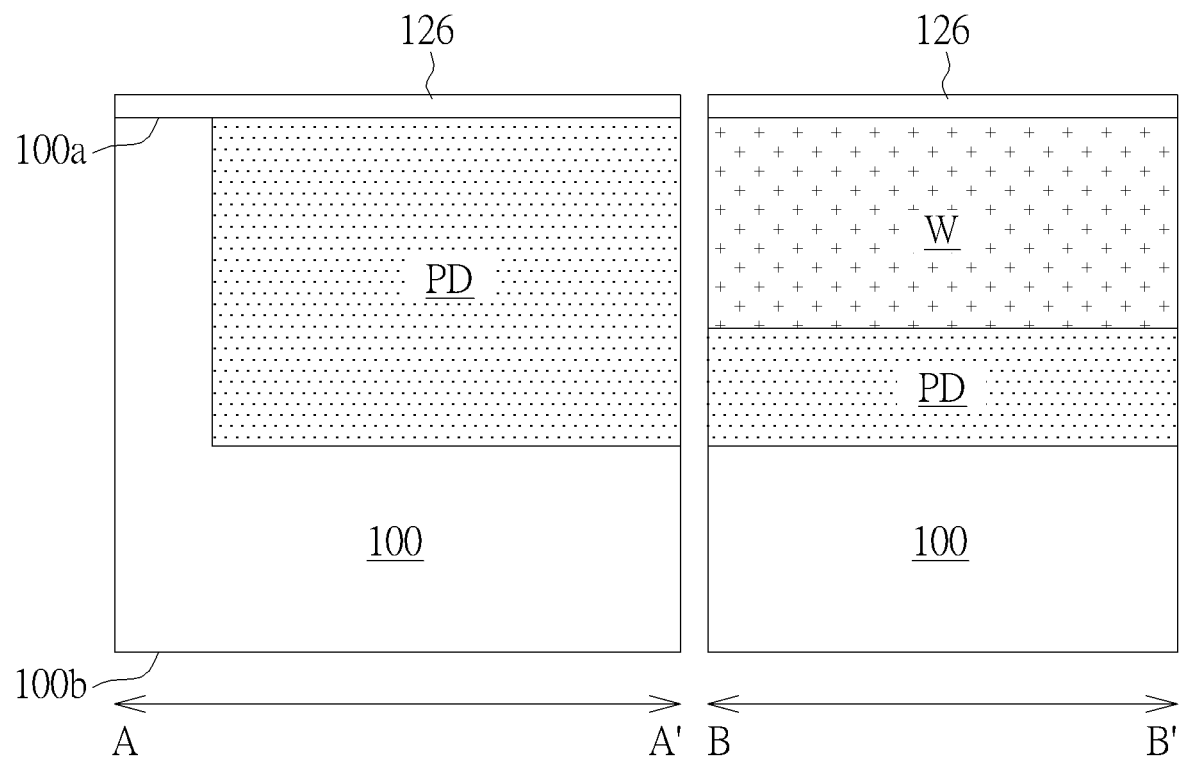
FIG. 2B, FIG. 3B, FIG. 4B, FIG. 5B, FIG. 6B, FIG. 7B, FIG. 8B and FIG. 9B are schematic cross-sectional views illustrating the process flow of fabricating the 3D CMOS image sensor structure in accordance with the preferred embodiment of present invention.

Firstly, please refer to FIG. 2A and FIG. 2B. A semiconductor substrate 100, ex. a P-type lightly doped silicon substrate, is provided with a front surface (faces up in the FIG. 100a as a non-light-receiving surface and a back surface (faces down in the FIG. 100b as a light-receiving surface. A block oxide layer 126, ex. a silicon oxide layer, is formed on the front surface 100a of semiconductor substrate 100 in advance, which may be formed through thermal oxidation process or deposition process. The function of block oxide layer 126 is to prevent the photoresist used in later ion implantation process from contaminating the semiconductor substrate 100 and to prevent the ion implantation process from damaging the substrate surface. Next, an ion implantation process is performed to form doped regions like photodiode PD and well W (ex. N-type photodiode and P-type well) respectively in the semiconductor substrate 100. Detailed steps of the ion implantation process may include forming a photoresist on the block oxide layer 126 to define the regions of photodiode PD and well W, then the ion implantation process is performed to dope dopants of different types, ex. P-type boron (B) atoms or N-type phosphorous (P), arsenic (As) atoms, into the defined regions. A tempering process is performed thereafter to activate the dopants and form these doped regions. In the embodiment of present invention, the photodiode PD and the well W formed in the process may partially overlap each other in the direction vertical to the front surface 100a of substrate, so that the surface of one pixel unit may be provided with two different doped regions of the photodiode PD and the well W.

Figure 3A:
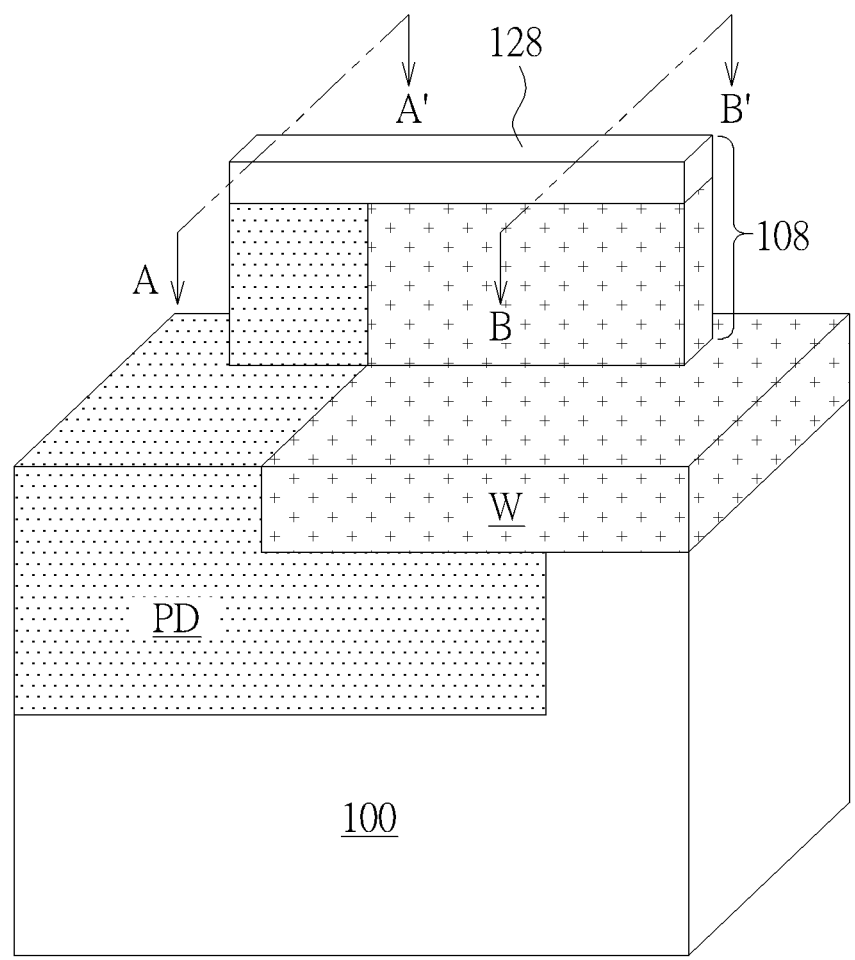
Figure 3B:
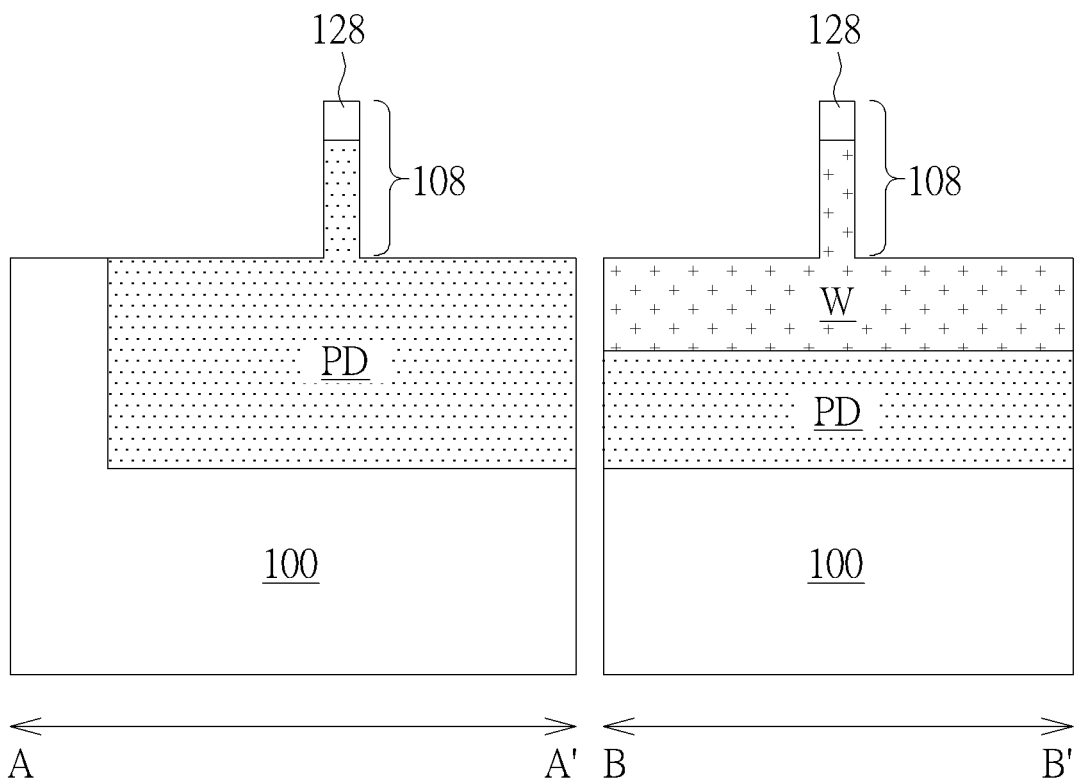

Please refer to FIG. 3A and FIG. 3B. After the photodiode PD and the well W are formed, an etching process is then performed to remove the block oxide layer 126. A patterning process is then performed to remove the semiconductor substrate 100 of a predetermined thickness, so as to form a protruding fin 108. The patterning process may include first forming a hard mask layer 128, ex. a silicon nitride layer, on the semiconductor substrate 100, then patterning the hard mask layer 128 through the photoresist and an etching process. As shown in FIG. 3A, in the embodiment of present invention, the hard mask layer 128 after patterning would extend over two different regions of the photodiode PD and the well W. Thereafter, performing an etching process using the patterned hard mask layer 128 as an etch mask to remove the semiconductor substrate 100 of a predetermined thickness, so as to form the protruding fin 108. It can be seen in the figure that, in the embodiment of present invention, the fin 108 is composed collectively of the extensions of the photodiode PD and the well W. Please note that this step may also form the fins of other transistor devices simultaneously in the CMOS image sensor, such as source follower and selector.

Figure 4A:
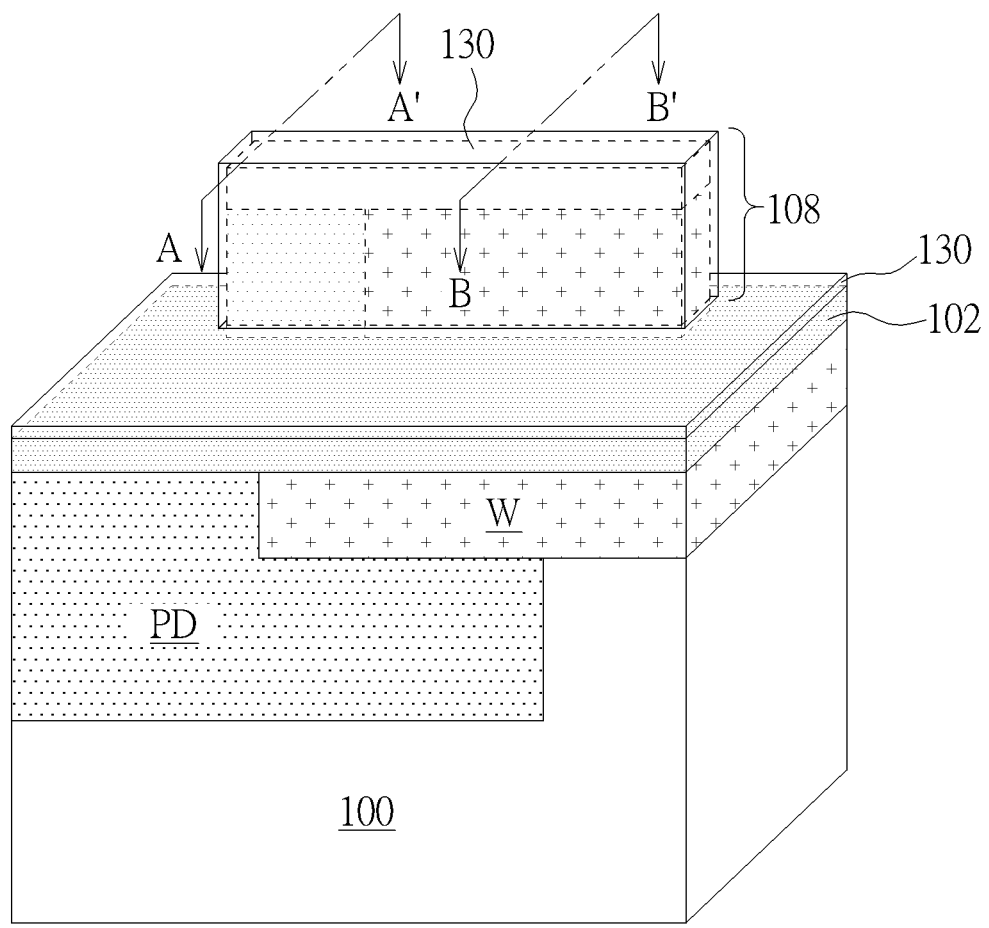
Figure 4B:
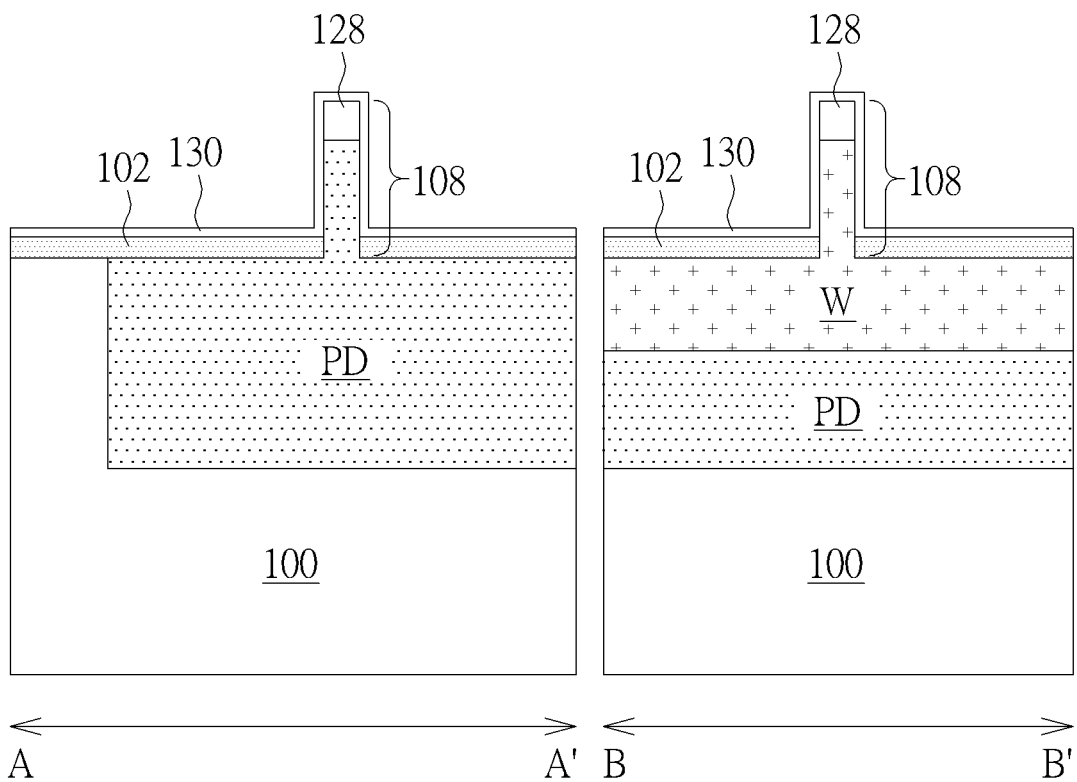

Please refer to FIG. 4A and FIG. 4B. After the fin 108 is formed, another block oxide layer 130, ex. a silicon oxide layer, is formed on entire substrate surface including the fin 108, which may be formed similarly through thermal oxidation process or deposition process. Thereafter, an ion implantation process is performed to form a surface doped layer 102, ex. a P+ heavily doped layer, on entire surface of the semiconductor substrate 100. The type of dopant in the surface doped layer 102 is opposite to the one in photodiode PD and is the same as the one in well W, however, with a doping concentration far higher than the one in well W. For example, when the photodiode PD is N-type photodiode and the well W is P-type well, the surface doped layer 102 will be a P+ heavily doped layer, which may prevent the issue of dark current or noise resulted from the generation or recombination effects of electrons and holes formed at interface defects between the semiconductor substrate 100 and adjacent oxide-based structures. Please note that the scope of surface doped layer 102 is confined in the substrate surface without being formed inside the fin 108.

Figure 5A:
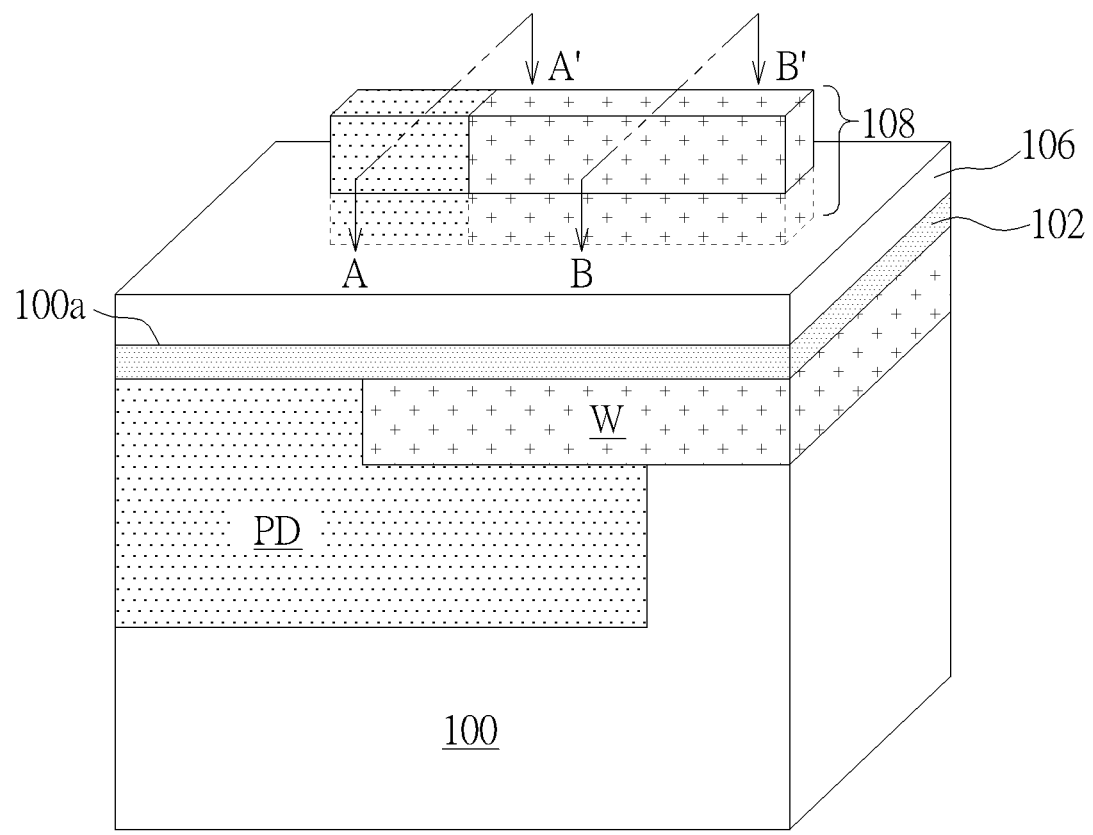
Figure 5B:
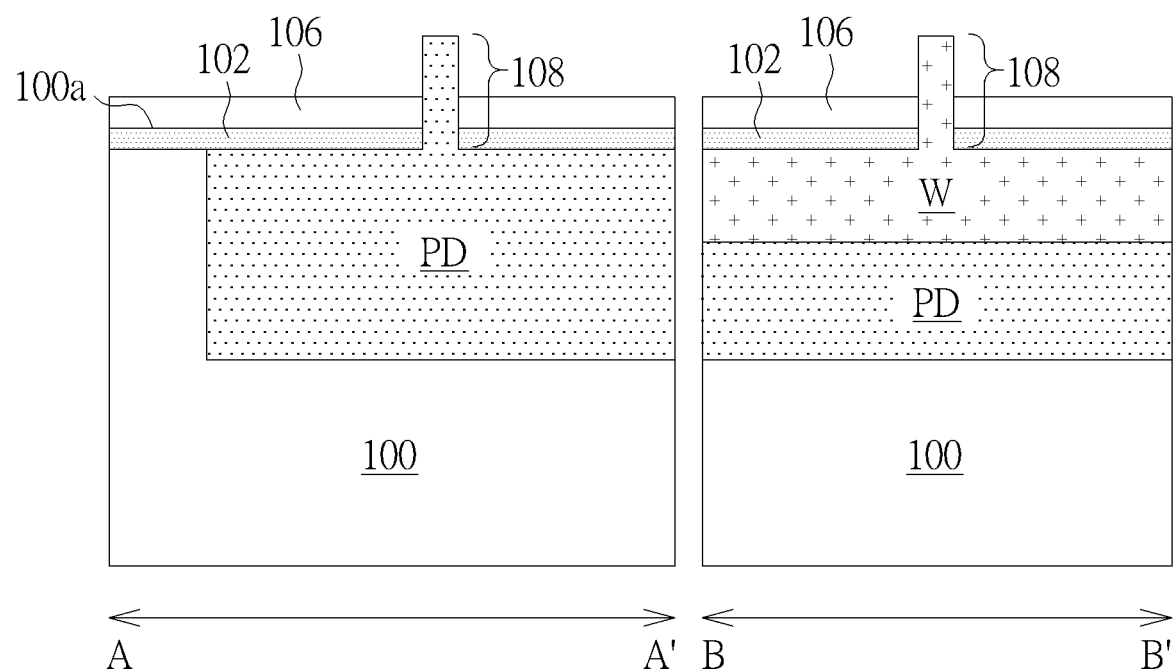

Please refer to FIG. 5A and FIG. 5B. After the surface doped layer 102 is formed, an etching process is performed to remove the block oxide layer 130. Thereafter, a shallow trench isolation layer 106 is formed on the surface doped layer 102. In the embodiment of present invention, the shallow trench isolation layer 106 covers the entire front surface 100a of substrate, while the fin 108 protrudes upwardly and vertically from the front surface 100a through the shallow trench isolation layer 106. The shallow trench isolation layer 106 may be formed by first blankly-depositing a thick silicon oxide layer on entire front surface 100a of the substrate (including fin 108), then performing a chemical mechanical planarization (CMP) process and an etch back process to the silicon oxide layer. The hard mask layer 128 on the fin 108 may be removed at the same time. The function of shallow trench isolation layer 106 in the present invention is to completely isolate the transistors in the pixel unit from the doped regions like underlying photodiodes PD, in order to significantly reduce crosstalk issue of photoelectric signal therebetween.

Figure 6A:
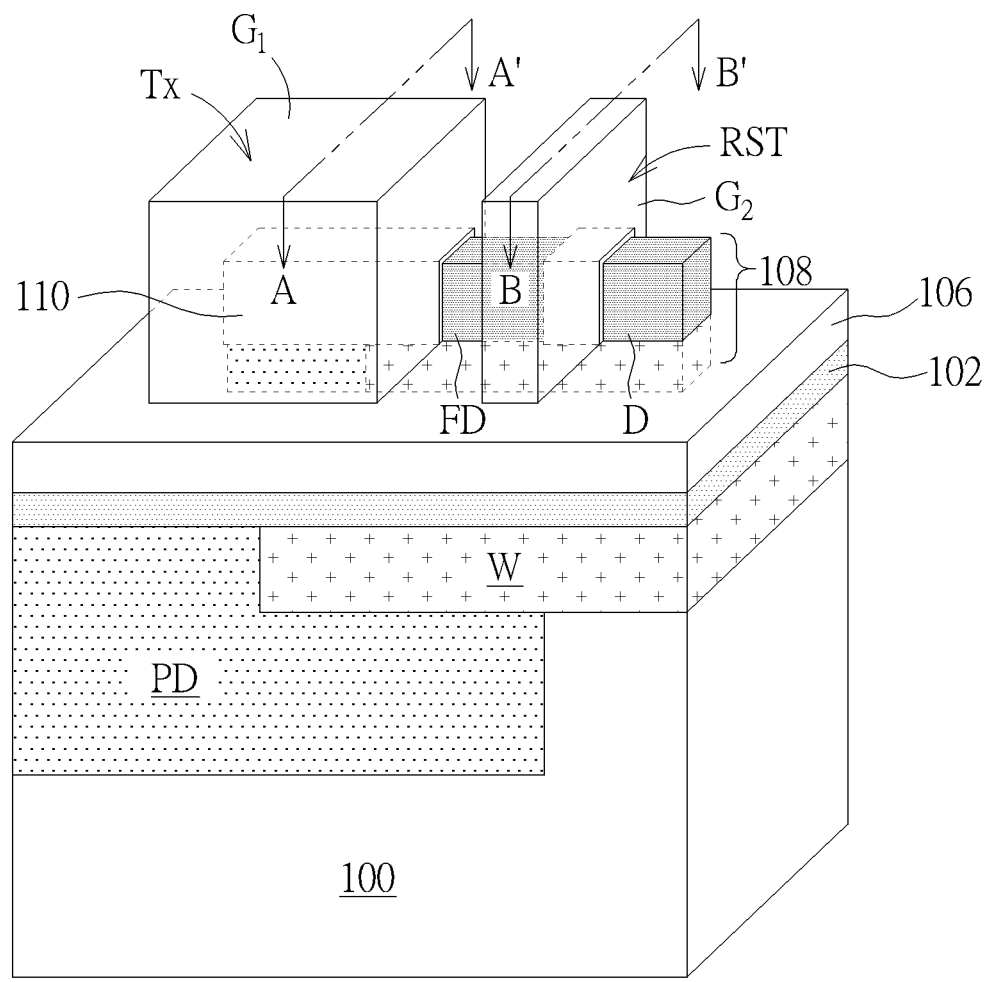
Figure 6B:
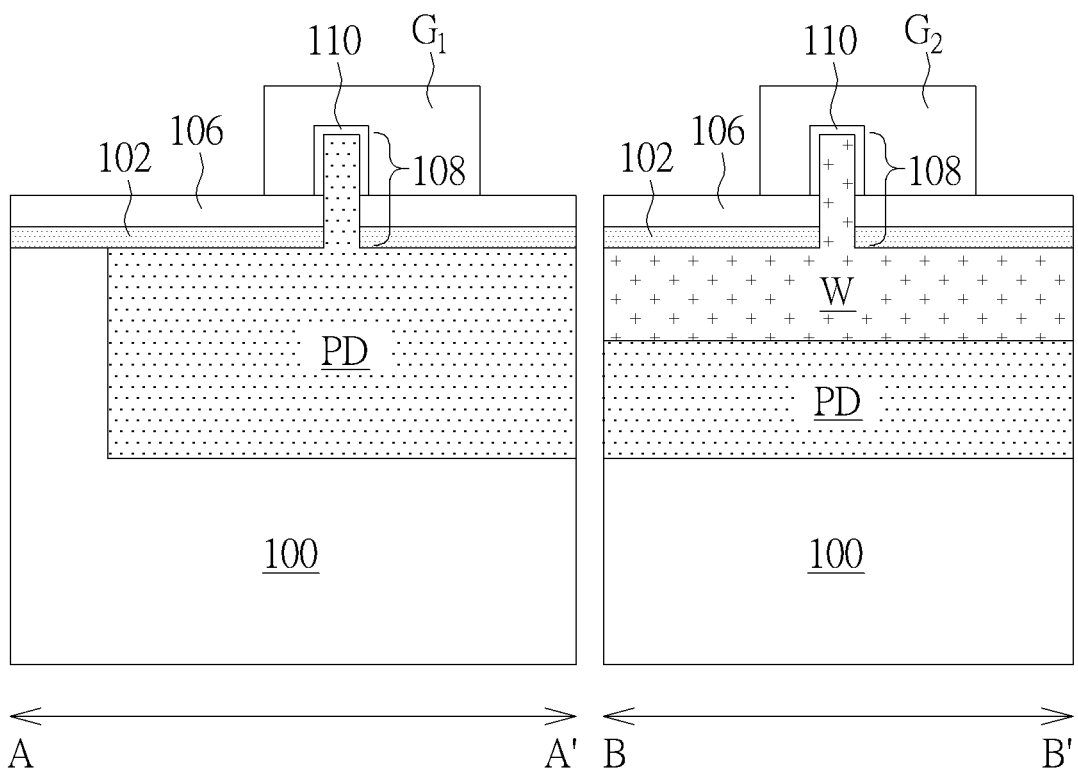

Please refer to FIG. 6A and FIG. 6B. After the shallow trench isolation layer 106 is formed, a gate insulating layer 110, ex. a silicon oxide layer or high-k dielectric layer, is then formed on the surface of exposed fin 108, which may be formed through atomic layer deposition (ALD) method. The gate insulating layer 110 may also cover the shallow trench isolation layer 106. Next, a first gate $G_1$ and a second gate $G_2$ are formed on the shallow trench isolation layer 106, with materials like polysilicon, metal or stacking structure with metal and polysilicon, such as N− doped polysilicon, which may be formed by first depositing a polysilicon layer on the substrate surface through silane thermal decomposition, then performing a patterning process to the polysilicon layer to form simultaneously the first gate $G_1$ and the second gate $G_2$ on the substrate. Please note that this step may also form the gates of other transistor devices simultaneously in the CMOS image sensor, such as source follower and selector. In the embodiment of present invention, the first gate $G_1$ and the second gate $G_2$ span over the photodiode PD portion and the well W portion of fin 108 on the shallow trench isolation layer 106 with the gate insulating layer 110 isolating therebetween, so that the first gate $G_1$ and the second gate $G_2$ constitute respectively the transfer transistor $T_X$ and the reset transistor RST of the 3D CMOS image sensor. Generally, the first gate $G_1$ covers entire photodiode PD of the fin 108 and the well W abutting the photodiode PD, while the second gate $G_2$ covers in the middle of the well W portion of the fin 108, with parts of well W exposed at two sides to form a drain D and a floating diffusion region FD. The well W of fin 108 covered by the first gate $G_1$ and the second gate $G_2$ are used as the channels of transfer transistor $T_X$ and reset transistor RST, respectively.

Please refer to FIG. 6A and FIG. 6B. After the first gate $G_1$ and the second gate $G_2$ are formed, an etching process is then performed to remove the gate insulating layer 110 on the exposed fin 108, and an ion implantation process is performed using the first gate $G_1$ and the second gate $G_2$ as a mask to dope the exposed fin 108 at two sides to form the drain D and the floating diffusion region FD, ex. N+ heavily doped region, so as to constitute an NMOS device (may be PMOS device in other embodiment). The aforementioned ion implantation process may also form drains and sources of other transistors in the CMOS image sensor. The floating diffusion region FD is between the first gate $G_1$ and the second gate $G_2$, and the transfer transistor $T_X$ may be electrically connected with the reset transistor RST through the floating diffusion region FD. The gate insulating layer 110 in previous step may be removed after forming the drain D and the diffusion region FD. Another advantage of this approach is that the source of transfer transistor $T_X$ (i.e. the upwardly-extending part of the photodiode PD) is in a form of fin enclosed by the first gate $G_1$, thus it may not be affected by the implantation process. In comparison thereto, the source of conventional planar transfer transistor is not covered by a gate, thus it may be easily affected by the implantation process and its original property may be altered.

Figure 7A:
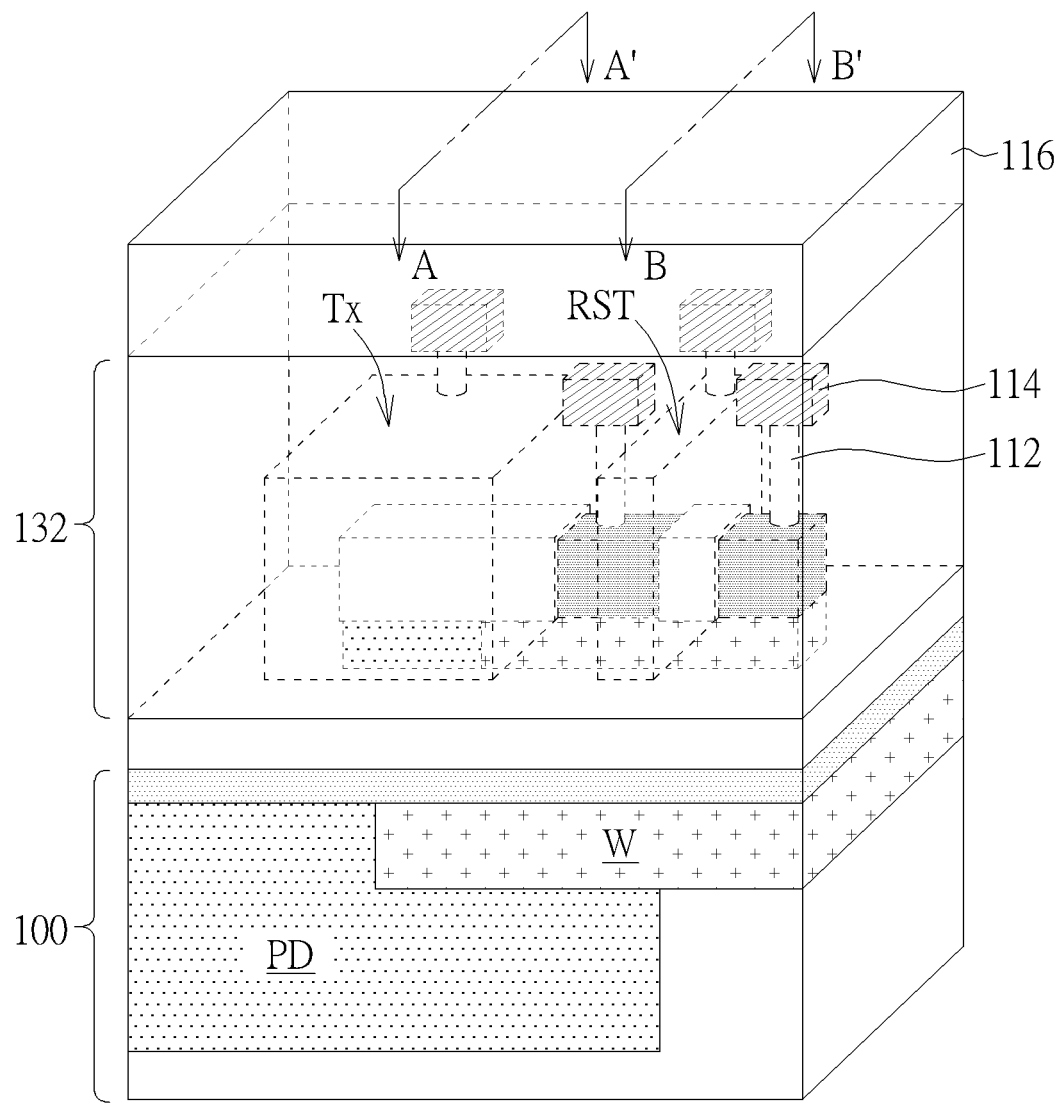
Figure 7B:
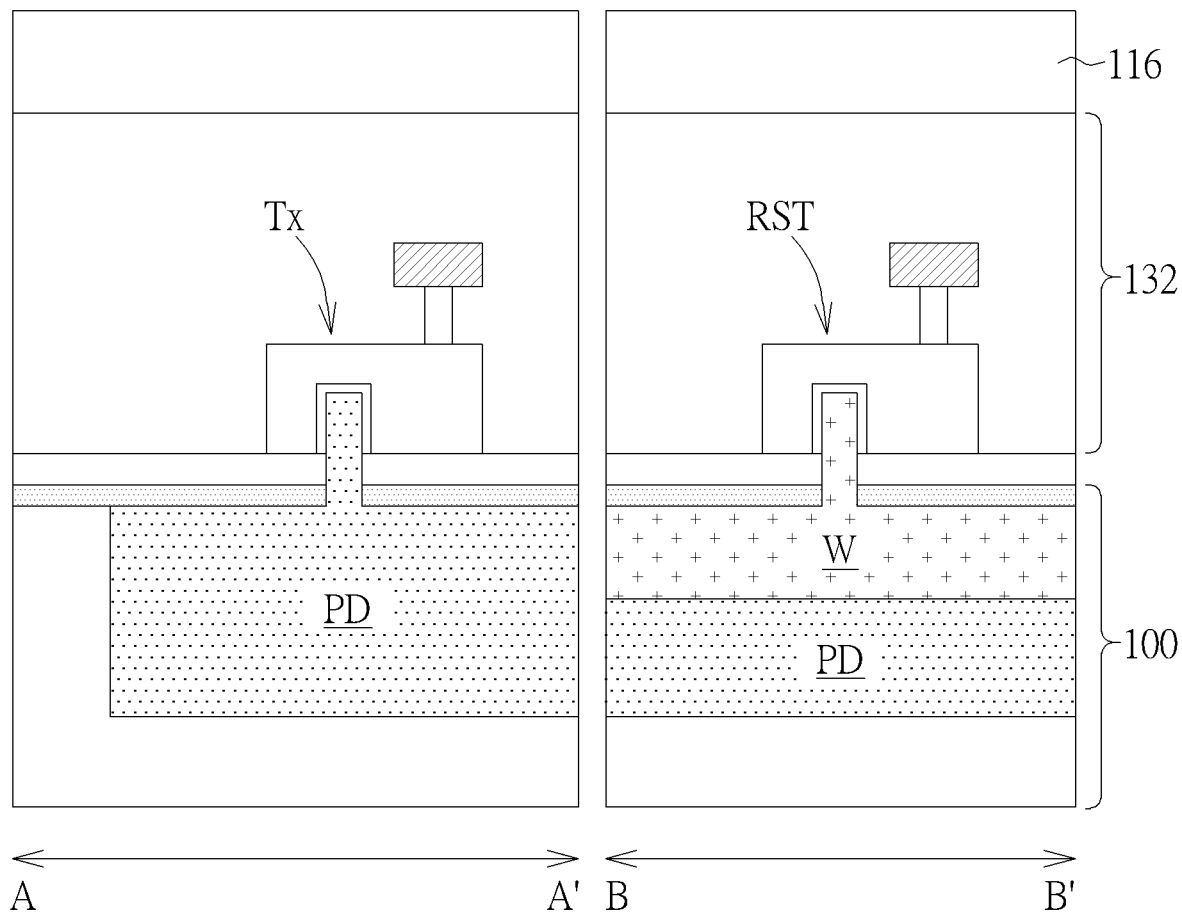

Please refer to FIG. 7A and FIG. 7B. After the gates $G_1$, $G_2$, drain D and the floating diffusion region FD are formed, a common CMOS BEOL process is then performed to form BEOL interconnects, including a dielectric layer 132 covering the shallow trench isolation layer 106 and the aforementioned various devices and contacts 112 and conductive lines 114 in the dielectric layer 132. Components like first gates G₁, second gate G₂, drain D and the floating diffusion region FD may be connected with external circuits through the contacts 112 and conductive lines 114 connected therewith, wherein the dielectric layer 132 may be formed through CVD process with materials like silicon oxide or low-k dielectrics. Interconnects like contacts 112 and conductive lines 114 may be formed through dual-damascene process after forming the dielectric layer 132, with materials like copper (Cu). After the BEOL interconnects are formed, a carrier substrate 116, ex. high temperature resistant glass, glass-based materials, or alternatively semiconductor materials, may be bonded on the dielectric layer 132 to serve as a substrate for the backside grinding process later. In following processes, entire semiconductor substrate 100 will be flipped and the carrier substrate 116 will be used as a substrate with the back surface 100b as a process surface to continue later processes, ex. backside grinding process, which may thin the semiconductor substrate 100 to a predetermined thickness through grinding or etching method.

The following processes in the present invention are now all performed with the back surface 100b (faces down in the figure) of semiconductor substrate 100 as a process surface. However, the structures in following figures are not correspondingly flipped for the conciseness of drawings and to provide a better understanding for the reader.

Figure 8A:
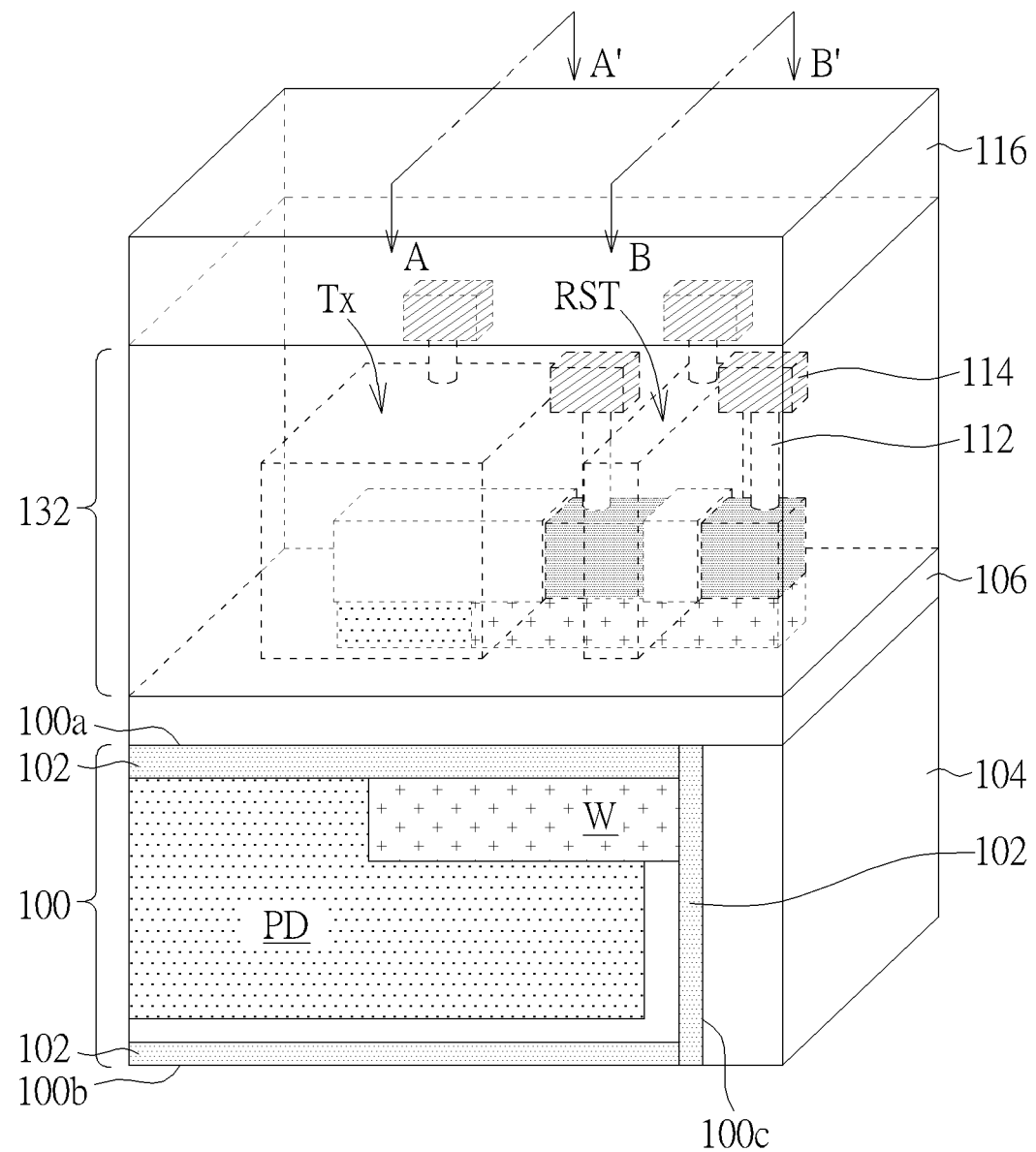
Figure 8B:
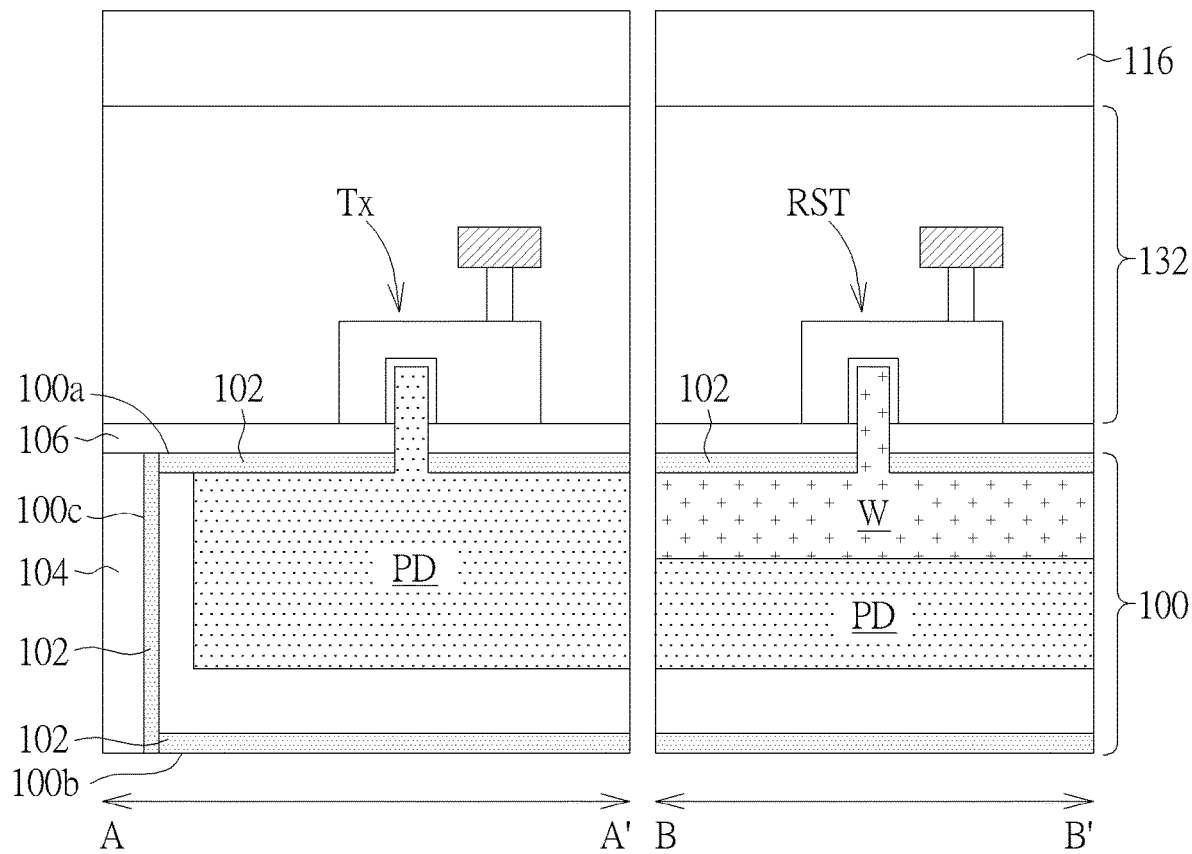

Please refer to FIG. 8A and FIG. 8B. After the backside grinding, a surface doping process is performed to form another surface doped layer 102, ex. a P+ heavily doped layer, on entire back surface 100b and sidewalls 100c of the semiconductor substrate 100 (between the semiconductor substrate 100 and the deep trench isolation 104). In the embodiment of present invention, the surface doping may be achieved by using ion implantation or plasma doping technology. Similar to the surface doped layer 102 on the front surface 100a, the doping type of surface doped layer 102 on the back surface is opposite to the one of photodiode PD and is the same as the one in well W, however, with a doping concentration far higher than the one in well W, in order to prevent the issue of dark current or noise resulted from the generation or recombination effects of electrons and holes formed at interface defects between the semiconductor substrate 100 and adjacent oxide-based structures. The surface doped layer 102 on the back surface 100b and sidewalls 100c of semiconductor substrate 100 may be formed by forming deep trench from the back surface 100b in the semiconductor substrate 100 and then performing a surface doping process to dope the surface area of back surface 100b and sidewalls 100c of the deep trench. It can be seen in the embodiment of present invention that the front surface 100a, back surface 100b and sidewalls 100c of the semiconductor substrate 100 are all covered by the surface doped layer 102 formed in the process, which completely encloses the photodiode PD and the well W, thereby further isolating the charges at interface defects. After the surface doped layer 102 is formed, the deep trench isolation 104 may be formed by filling isolating materials in the deep trench, such as oxides and/or undoped polysilicon with refractive index smaller than the one of semiconductor substrate 100, to achieve total internal reflection. In the embodiment of present invention, the depth of deep trench isolation 104 may encompass entire semiconductor substrate 100, to the shallow trench isolation layer 106 on the front surface 100a. In this way, the shallow trench isolation layer 106 and the deep trench isolation 104 may collectively enclose the photodiode PD in the pixel unit (except the back surface 100b for receiving light), so that crosstalk issue caused by the photoelectric signal to adjacent devices may be significantly reduced.

Figure 9A:
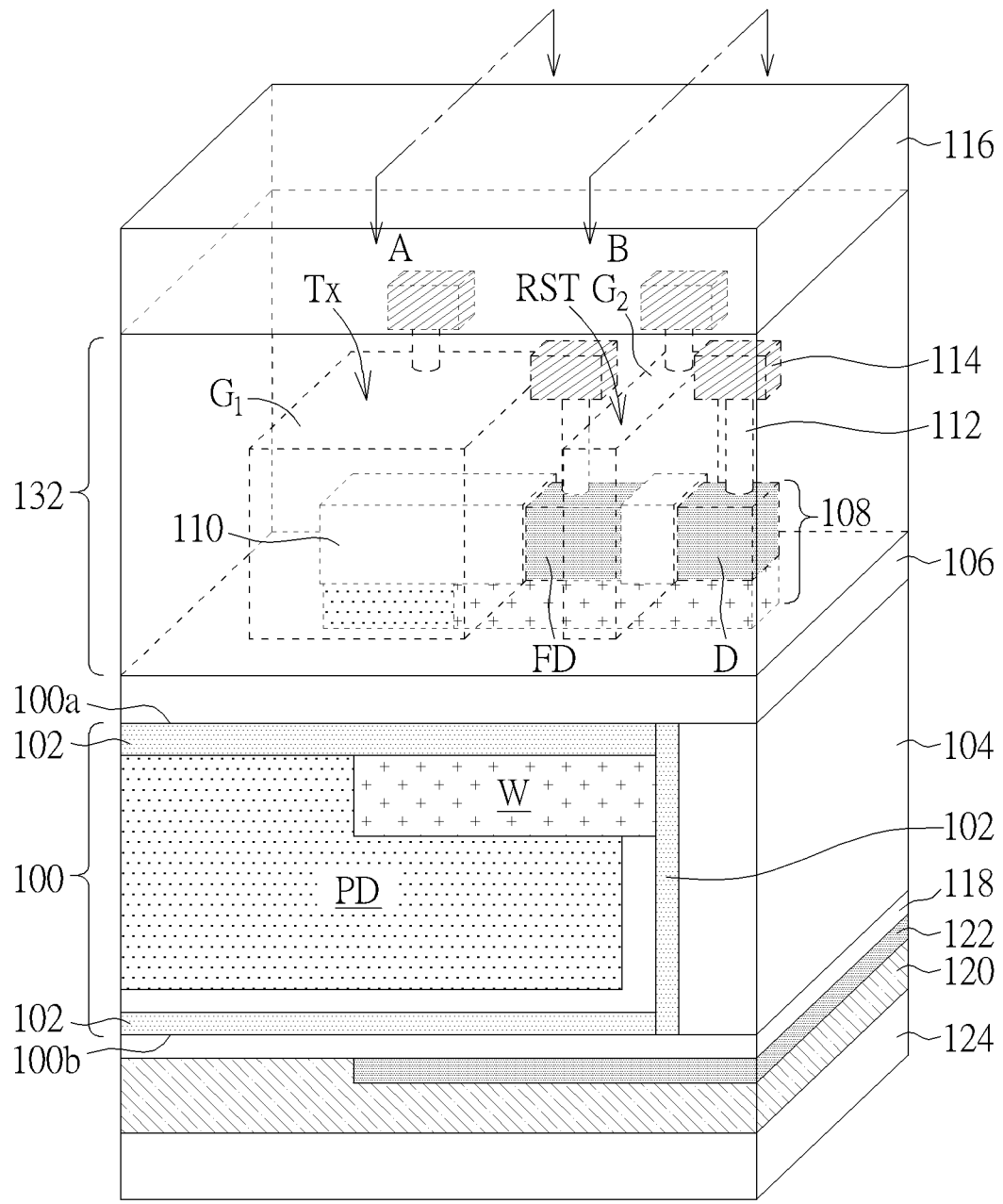
Figure 9B:
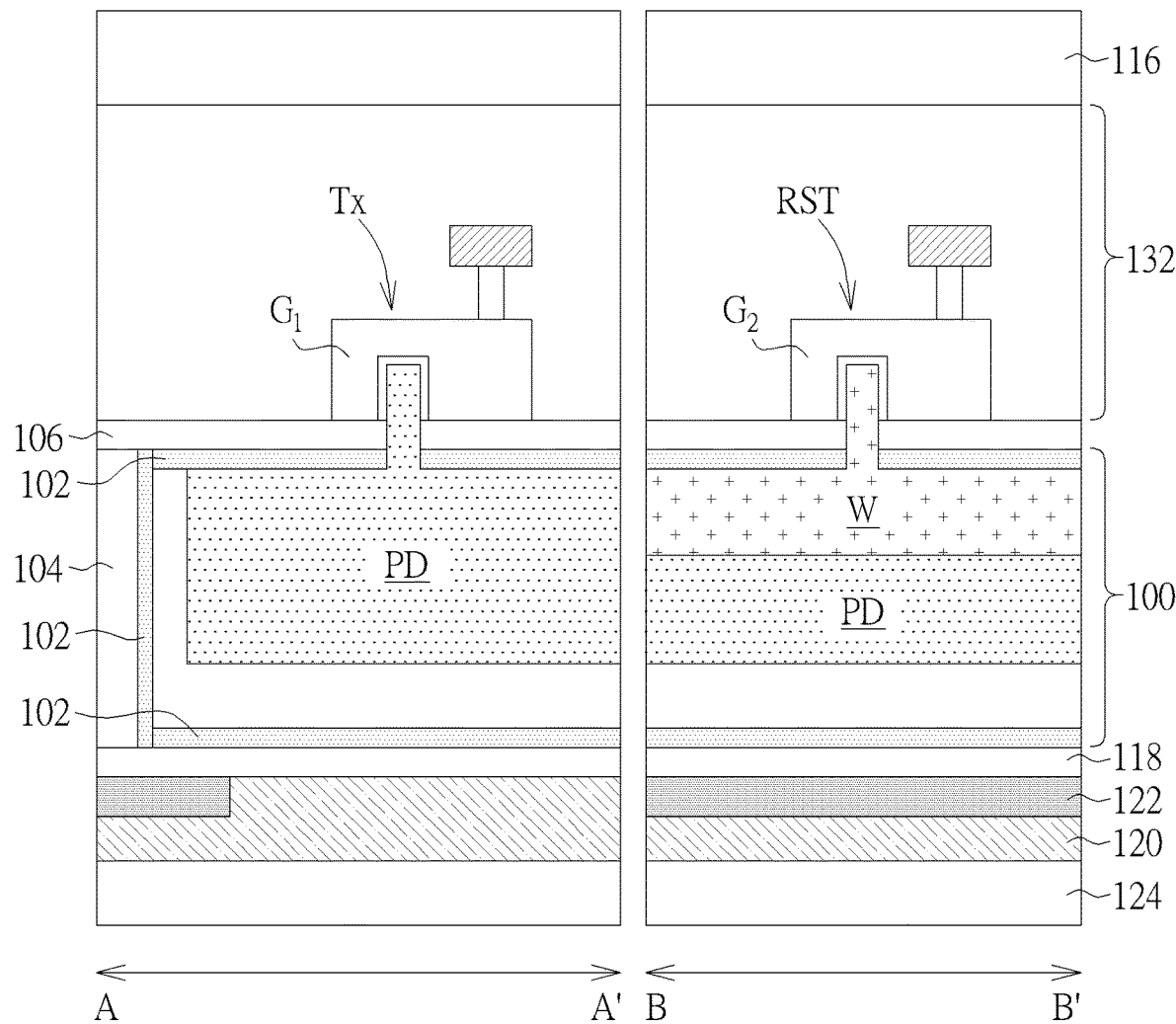

Please refer to FIG. 9A and FIG. 9B. After the surface doped layer 102 and the deep trench isolation 104 are formed on the back surface 100b of substrate, structures like anti-reflection layer 118, light shielding layer 122, color filter layer 120 and micro lens 124 are formed sequentially on the back surface 100b. The material of anti-reflection layer 118 may be material with refraction index smaller than the one of semiconductor substrate 100, such as silicon oxide ($SiO_2$), silicon nitride (SiN) and/or titanium oxide ($TiO_2$). It may also be a multilayer structure with gradient refractive index to achieve better incidence effect. The light shielding layer 122 may be a tungsten film. Preferably, the light shielding layer 122 fully or mostly overlaps the well W, reset transistor RST and other transistors in the direction vertical to the back surface 100b, in order to reduce the amount of stray light when the image light enters. The color filter layer 120 is formed through spin-coating light-sensitive resins having pigments or dyes on the substrate. The material of micro lens 124 may be resin-based material like styrene, acrylic acid and siloxane, which may be formed through thermal type photolithography process, diffusion plate photolithography process or drop method process, etc.

In summary to the aforementioned embodiments, the 3D CMOS image sensor structure provided in the present invention implements the design of pixel transistor devices and photodiode sharing common layout area, thereby significantly reduce necessary layout space. The pixel size may be miniaturized without compromising full well capacity and fill factor required by the sensor. In addition, the structure of 3D pixel transistor has better controllability to gates, which may reduce sub-threshold swing of the devices. Furthermore, the design of 3D transistor protruding from the substrate may completely isolate the transistors and the doped regions of substrate by using the shallow trench isolation layer covering the entire substrate surface cooperating with the deep trench isolation formed in the substrate, thereby effectively solving the crosstalk issue. The advantages of the structure and method of present invention are as stated above.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A 3D CMOS image sensor structure, comprising:
a semiconductor substrate with a front surface and a back surface;
a photodiode formed in said semiconductor substrate;
a well formed in said semiconductor substrate, and said well partially overlaps said photodiode in a direction vertical to said front surface;
a shallow trench isolation layer formed on said front surface;
a fin protruding upwardly on said front surface from said semiconductor substrate through said shallow trench isolation layer, wherein said fin is composed of said photodiode and said well, and a photodiode portion of said fin horizontally and directly connects a well portion of said fin;
a first gate on said shallow trench isolation layer and spanning both said photodiode portion of said fin and said well portion of said fin abutting said photodiode to constitute a transfer transistor;

a second gate on said shallow trench isolation layer and spanning only said well portion of said fin to constitute a reset transistor; and a floating diffusion region in said well portion of said fin between said first gate and said second gate, wherein said transfer transistor is electrically connected with said reset transistor through said floating diffusion region.

2. The 3D CMOS image sensor structure of claim 1, further comprising a deep trench isolation in said semiconductor substrate, wherein said deep trench isolation and said shallow trench isolation layer connect each other and collectively enclose said photodiode and said well.

3. The 3D CMOS image sensor structure of claim 2, further comprising a surface doped layer on said front surface, said back surface of said semiconductor substrate and sidewalls of said deep trench isolation and enclosing said photodiode and said well.

4. The 3D CMOS image sensor structure of claim 3, wherein said photodiode is N-type doped region, said well is P-well, and said surface doped layer is P-type heavily doped region.

5. The 3D CMOS image sensor structure of claim 1, further comprising an anti-reflection layer on said back surface of said semiconductor substrate.

6. The 3D CMOS image sensor structure of claim 1, further comprising a color filter layer on said back surface.

7. The 3D CMOS image sensor structure of claim 1, further comprising a micro lens on said back surface.

8. The 3D CMOS image sensor structure of claim 1, further comprising a light shielding layer on said back surface and overlapping said well and said reset transistor in a direction vertical to said back surface.

9. The 3D CMOS image sensor structure of claim 1, wherein said fin comprises a first sub-fin and a second sub-fin separated from each other, and said first gate is on said first sub-fin and said second gate is on said second sub-fin, and said first sub-fin is composed of said photodiode portion and said well portion, and said second sub-fin is completely composed of said well portion, and said floating diffusion region comprises a first floating diffusion sub-region and a second floating diffusion sub-region respectively in said well portion of said first sub-fin and said well portion of said second sub-fin and electrically connected each other through interconnects.

10. The 3D CMOS image sensor structure of claim 9, wherein said well is divided into a first sub-well and a second sub-well corresponding respectively to said first sub-fin and said second sub-fin by a deep trench isolation.

* * * * *